(12) United States Patent
Sorensen et al.

(10) Patent No.: US 7,392,144 B2
(45) Date of Patent: Jun. 24, 2008

(54) METHOD FOR DATA COMPRESSION AND ENCODING

(75) Inventors: Gary P. Sorensen, Laguna Nigel, CA (US); Ralph E. Svetic, Chandler, AZ (US)

(73) Assignee: Alcon, Inc., Hunenberg (CH)

( * ) Notice: Subject to any disclaimer, the term of this patent is extended or adjusted under 35 U.S.C. 154(b) by 3 days.

(21) Appl. No.: 11/545,279

(22) Filed: Oct. 10, 2006

(65) Prior Publication Data

US 2008/0086279 A1 Apr. 10, 2008

(51) Int. Cl.
*G06F 19/00* (2006.01)
*F04B 43/08* (2006.01)

(52) U.S. Cl. .................... 702/94; 417/477.2
(58) Field of Classification Search ............... 702/94, 702/85, 87, 95, 98; 73/1.16; 417/477.2; 604/30

See application file for complete search history.

(56) References Cited

U.S. PATENT DOCUMENTS

| | | | |
|---|---|---|---|
| 4,833,306 A | 5/1989 | Milbrett | |
| 4,844,259 A | 7/1989 | Glowczewskie et al. | |
| 5,048,870 A | 9/1991 | Mangini et al. | |
| 5,106,366 A * | 4/1992 | Steppe | 604/30 |
| 5,283,943 A | 2/1994 | Aguayo et al. | |
| 5,364,342 A * | 11/1994 | Beuchat et al. | 604/30 |
| 5,408,076 A | 4/1995 | Griffanti | |
| 5,488,223 A | 1/1996 | Austin et al. | |
| 5,724,244 A | 3/1998 | Yabuki | |
| 5,800,396 A * | 9/1998 | Fanney et al. | 604/151 |
| 5,845,264 A | 12/1998 | Nellhaus | |
| 5,899,674 A | 5/1999 | Jung et al. | |
| 5,908,027 A * | 6/1999 | Butterfield et al. | 600/485 |
| 6,005,482 A | 12/1999 | Moran et al. | |
| 6,036,458 A | 3/2000 | Cole et al. | |
| 6,059,544 A | 5/2000 | Jung et al. | |
| 6,098,892 A | 8/2000 | Peoples, Jr. | |
| 6,110,110 A * | 8/2000 | Dublin et al. | 600/405 |
| 6,155,975 A | 12/2000 | Urich et al. | |
| 6,204,491 B1 | 3/2001 | Montani | |
| 6,238,623 B1 | 5/2001 | Amhof et al. | |
| 6,341,726 B1 | 1/2002 | Castanedo et al. | |
| 6,868,720 B2 * | 3/2005 | Lobdell et al. | 73/157 |

(Continued)

FOREIGN PATENT DOCUMENTS

DE 201 00 591 6/2001

(Continued)

OTHER PUBLICATIONS

Chan, W. L. et. al.; Institute of Electrical and Electronics Engineers; Real Time Data Compression for Power System Monitoring Using Programmable Gate Array; Proceedings of the Region Ten Conference (Tencon), vol. 3, pp. 616-619, Oct. 19, 1993.

(Continued)

*Primary Examiner*—John E Barlow, Jr.
*Assistant Examiner*—Toan M Le
(74) *Attorney, Agent, or Firm*—Kenneth D. Bassinger (57) ABSTRACT

A system and method for generating a calibration data curve, including communicating known calibration data for a microsurgical cassette to a surgical console with which the cassette will be used.

20 Claims, 3 Drawing Sheets

U.S. PATENT DOCUMENTS

| | | | |
|---|---|---|---|
| 6,902,542 B2 * | 6/2005 | Gordon ........................ | 604/35 |
| 6,955,073 B2 * | 10/2005 | Morgan et al. ................ | 73/1.58 |
| 2001/0006818 A1 | 7/2001 | Amhof et al. | |
| 2005/0285025 A1 * | 12/2005 | Boukhny et al. ......... | 250/231.1 |
| 2007/0107490 A1 | 5/2007 | Artsyukhovich et al. | |

FOREIGN PATENT DOCUMENTS

| | | |
|---|---|---|
| EP | 550124 | 7/1993 |
| JP | 409205291 A | 8/1997 |
| JP | A 2000 0217836 | 8/2000 |

OTHER PUBLICATIONS

Nygaard, R., et al.; "Signal Compression by Second Order Polynomials and Piecewise Non-Interpolating Approximation," Norsig-99; Norweglan Signal Processing Symposium Norsig Tronheim, Norway [Online] 1999, pp. 1-6, Retrieved from the internet: URL:http://citeseer.ist.psu.edu/cache/papers/cs/16858/http:zSzzpaperszSznorsig99_art.pdf/signal-compression-by-second.pdf> [retrieved on Nov. 30, 2007].

* cited by examiner

METHOD FOR DATA COMPRESSION AND ENCODING

FIELD OF THE INVENTION

This invention relates to systems and methods for encoding data in a compressed format. Certain embodiments allow encoding of calibration data for a microsurgical cassette within a single linear barcode.

BACKGROUND

Microsurgical instruments can be used by surgeons for removal of tissue from delicate and restricted spaces in the human body, particularly in surgery on the eye, and more particularly in procedures for removal of the crystalline lens or the vitreous body. Such instruments include a control console and a surgical handpiece with which the surgeon dissects and removes the tissue. The handpiece has a surgical tool such as an ultrasonic microsurgical cutter for cutting or fragmenting the tissue and is connected to the control console by a long power cable and by long conduits or flexible tubes for supplying an irrigation fluid to the surgical site and for withdrawing or aspirating fluid and fragmented tissue from the site. The cutting, irrigation and aspiration functions of the handpiece are controlled by the remote control console that not only provides power for the surgical cutter (e.g., an ultrasonically vibrated needle), but also controls the flow of irrigation fluid and provides a source of reduced pressure (relative to atmosphere) for the aspiration of fluid and fragmented tissue. The functions of the console are controlled manually by the surgeon, usually by means of a foot-operated switch.

The multiple connections that are required between the handpiece and the console for the power cable and the suction and irrigation lines have made the preparation and interconnection of the equipment prior to the surgical procedure extremely complex, with the resultant concerns over maintaining the sterility of the equipment and assuring error-free connection. Accordingly, the typical microsurgical instruments, the fluid handling connections have come to be centralized in a "cassette" that contains in one unit all of the connections for the aspiration and irrigation lines, internal conduits for directing the flow of fluids, valves for controlling the flow of fluids into and out of the handpiece, a receptacle for aspirated fluid and tissue, and may contain the tube portion of a peristaltic pump. The cassette typically is supplied in a sterile package with color-coded connecting tubing already attached. Thus, setting up the equipment requires only connecting the cassette tubing to the surgical handpiece and irrigation fluid source and inserting the cassette into a receptacle in the console. The receptacle may contain the roller head portion of a peristaltic pump (or some other access to reduced pressure), an aspiration line pressure sensor and devices for operating the valves in the cassette and for controlling the flow of irrigation or aspiration fluids through the fluid conduits within the cassette. For convenience and to maintain sterility, the cassette may be discarded after a single use or sterilized and reused.

Sensitive instruments such as these microsurgical cassettes can require very accurate calibration in order to function properly. For example, the microsurgical cassettes used to assist with surgical irrigation or suction in eye surgery require highly accurate pressure/displacement calibration curves to accurately determine a given pressure based on a measured diaphragm displacement. Because of the sensitive nature for calibrating such cassettes, and because each cassette can have a slightly different calibration curve, it is advantageous to communicate accurate calibration information specific to each individual cassette to the console with which the cassette will be used. Efficiently communicating calibration information can be difficult, particularly where the calibration curve is highly nonlinear and requires multiple coefficients for a modeling polynomial, or multiple data points for accurately reconstructing the specific calibration curve.

One solution for communicating calibration information is to break typical calibration curves down so as to be categorized into one of a predetermined number of categories. Such a method, however, has the obvious drawback of being unable to accurately reflect calibrations across a broad spectrum. Another method is to communicate the coefficients of a polynomial that models the calibration curve. For example, a fourth order polynomial can be used to model the pressure/deflection calibration curve illustrated in FIG. 3. By sending the coefficients for each term in the fourth order polynomial, the calibration curve can be reconstructed by the console with which the cassette is to be used. However, accurately reproducing a non-linear curve—especially higher order curves—requires communicating very precise coefficients and thus is not well suited for use with a small data space such as a single linear barcode.

Another method is to convey sufficient data points from the calibration curve so that the console can mathematically determine a function modeling the overall curve. For example, if the modeling function is an $n^{th}$ order polynomial, $n+1$ data points will fully determine the polynomial coefficients. Such a method is made difficult though by the fact that small deviations in the communicated values (due for example to rounding or measurement tolerance) can result in significant error in the calculated modeling function. This is particularly true of highly non-linear systems. Thus, communicating sufficient data points to fully and accurately determine a calibration curve typically requires communicating a large data set to reduce such deviations.

Microsurgical cassettes are often intended to be a single-use disposable or are otherwise produced in bulk quantities. Because the calibration information for each cassette is unique, it is desirable to include the calibration information for each cassette in a convenient form that can accompany the cassette. Traditional methods of providing $n+1$ data points with sufficient precision to determine a modeling polynomial, or providing sufficiently precise coefficients for an approximating polynomial for each device, can be cumbersome or impractical for use with a limited amount of data, such as a single barcode. What is needed then is a method for conveying accurate calibration data in an efficient and compact manner. Embodiments of the present invention address this problem by presenting systems and methods for compressing and encoding data, such as calibration data, so that it can be communicated in a more succinct and cost-effective manner. According to one embodiment, pressure/displacement calibration data for a disposable microsurgical cassette can be compressed to fit within a single barcode on the disposable cassette. According to other embodiments, other methods for compressing data and for extracting information from compressed data are presented.

SUMMARY

Figure 3:
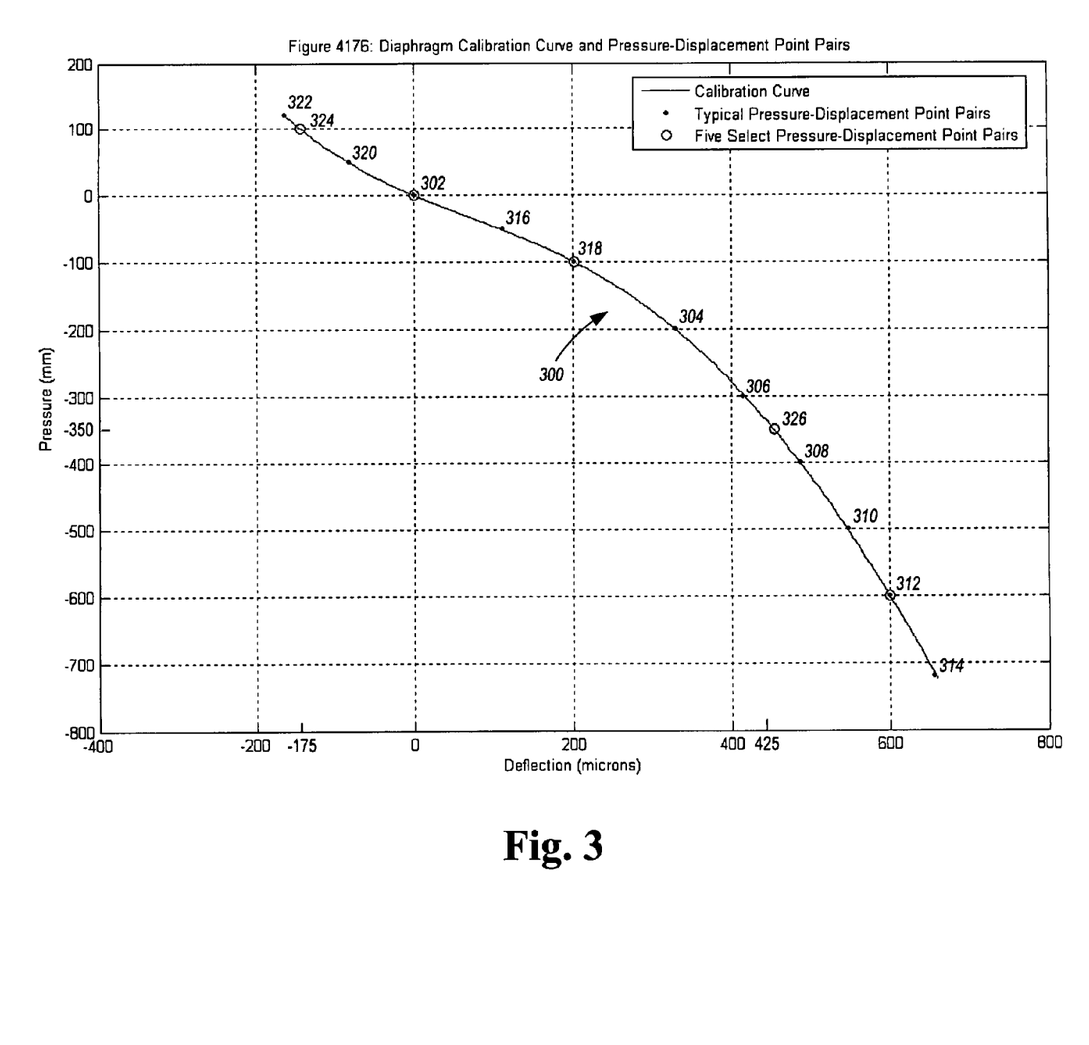
FIG. 3 illustrates an example of a calibration curve as may be used with a sample embodiment of the present invention.

According to one embodiment, a method is provided for communicating known calibration data for a microsurgical cassette to a surgical console with which the cassette will be used. One type of calibration curve for a microsurgical cassette correlates pressure with the displacement of a diaphragm within the cassette. One example of such a calibration curve is shown in FIG. 3. The calibration curve shown in FIG. 3 allows precise pressures to be determined during use of the cassette by measuring the diaphragm displacement and correlating the measured displacement with the calibration curve. This can be done, for example, by way of a mathematical function modeling the curve. For example, in the case of the curve shown in FIG. 3, a forth order polynomial approximating the curve 300 can be used by the console to identify pressure values based on measured diaphragm displacements.

Because each microsurgical cassette may have a slightly different calibration curve, it is desirable to quickly and accurately convey the calibration information for an individual cassette to the particular console with which it will be used. Embodiments of the present invention provided methods for doing this by encoding calibration data in a compact enough form to fit in a medium—such as a linear barcode—accompanying each cassette.

According to one embodiment, certain data points from a calibration curve are selected that determine the overall behavior of the particular calibration curve in a manner least susceptible to minor changes in the data points. These points are known as select calibration points. In FIG. 3, five select calibration points are illustrated, including the origin 302. The select points have been determined heuristically to reduce error when modeling a curve based on the select calibration points despite small deviations in the actual values of the select data points. For example, while ideally any five points along the curve 300 would determine a $4^{th}$ order polynomial modeling the behavior of the curve, because the values cannot be determined and communicated with 100% accuracy, some error results when identifying a function modeling a calibration curve based on a given set of points. It has been discovered that this error can be reduced by a proper selection of calibration points. In the example illustrated in FIG. 3, two points 324 and 318 close to and on either side of the origin 302, data point 312 towards the end of the curve 300, and data point 326 at an intermediate point along the curve 300 will determine the actual curve 300 with less susceptibility to minor errors in each of the data points than other points along the curve 300 such as points 322, 320, 316, 304 or 310, for example.

Within the set of select calibration points, predictor calibration points can also be identified. The predictor calibration points are points heuristically determined to accurately predict values for the remaining select calibration points when used with a predictor function. For example, it has been discovered that given the two select calibration points 324 and 318 in FIG. 3, the deflection values for points 326 and 312 can be predicted using a simple linear function of the deflection values corresponding to these two points better than if a function based on values corresponding to other select calibration points is used. Embodiments of the present invention utilize the fact that the points 324 and 318 accurately predict the remaining select calibration points to reduce the information needed to communicate these points by encoding only corrections from the predicted values for the non-predictor select calibration points. Thus for the curve 300, values corresponding to predictor calibration points 324 and 318 are encoded directly, whereas only corrections for values corresponding to calibration points 326 and 312 are encoded.

A console with which the microsurgical cassette will be used can then scan the barcode to extract the encoded values from the barcode accompanying the cassette and accurately determine the proper coefficients for the modeling polynomial for the individual cassette. The modeling polynomial can then be used to identify a pressure for a measured diaphragm displacement during use of the cassette. Other features, benefits, and embodiments of the disclosed invention are set forth below.

DETAILED DESCRIPTION OF THE PREFERRED EMBODIMENTS

Throughout this specification, embodiments of the present invention will be discussed in the context of pressure/displacement calibration data for a pressure diaphragm of a microsurgical cassette. This context is provided to facilitate the disclosure and is only one example of the data compression technique disclosed herein. The specifics pertaining to this particular context should not be understood as limitations to the disclosed or claimed embodiments. The disclosed data compression method can be used with any suitable data set and is not limited to calibration data or data for a particular type of apparatus. Also, this disclosure uses an example of a microsurgical cassette whose pressure/deflection calibration curve is modeled by a fourth order polynomial in order to provide a specific example and facilitate the disclosure. The choice of this example is not intended to limit the claimed embodiments to only this type of data set. For example, the compression techniques disclosed herein apply equally well to compressing data represented by any suitable modeling function such as a Fourier series, periodic function, exponential function, hyperbolic function, logarithmic function, or trigonometric function, which can be approximated using the methods disclosed.

A sample calibration curve 300 useful for explaining methods disclosed herein is shown in FIG. 3. The sample calibration curve 300 is a pressure/displacement calibration curve for a microsurgical cassette. The curve shows pressure values for given diaphragm displacements within the cassette. The sample curve 300 was determined empirically for a given microsurgical cassette and can be communicated to the console with which the cassette will be used so that precise pressures can be determined during a procedure by measuring the diaphragm displacement within the cassette.

Figure 1:
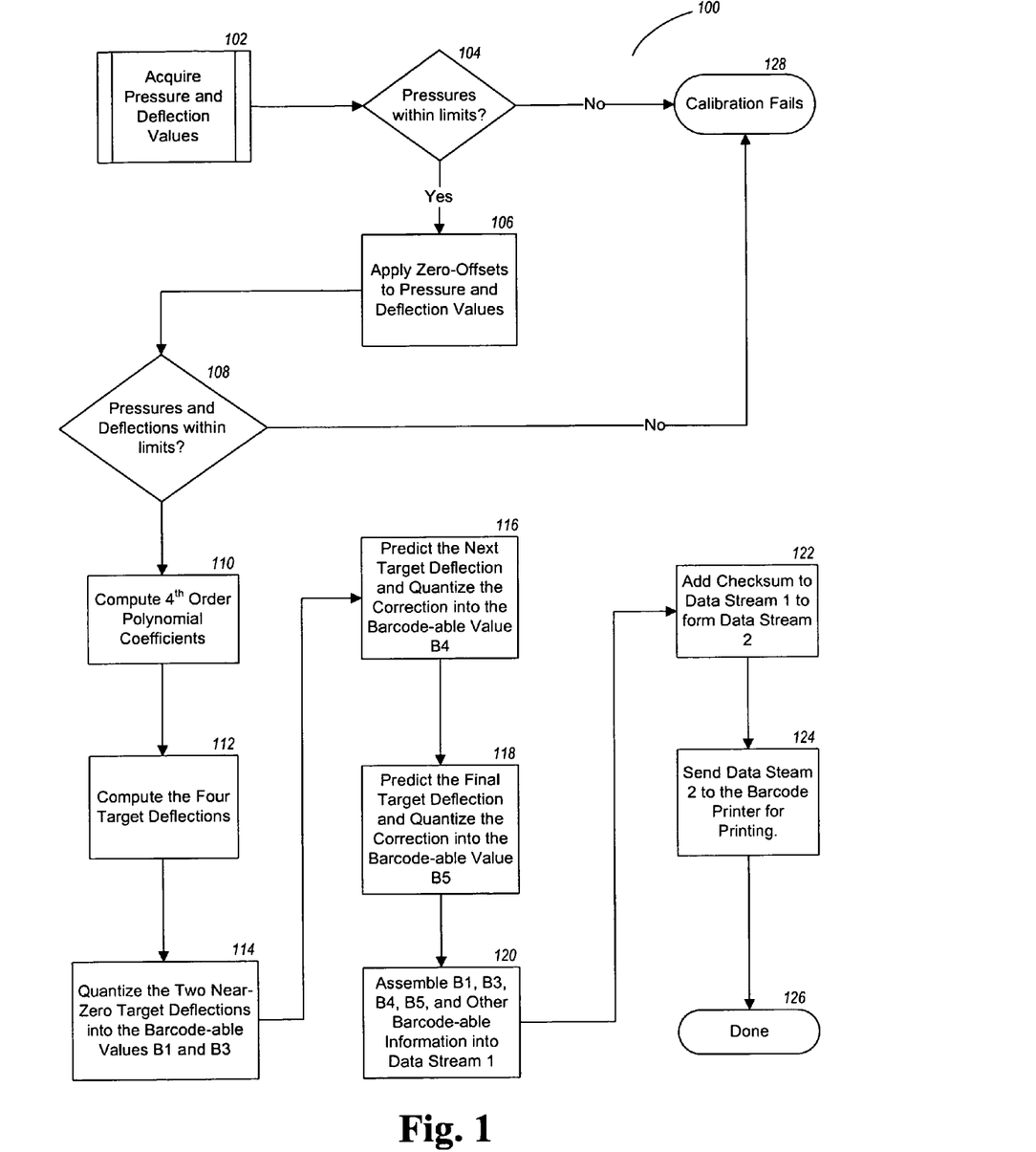
FIG. 1 illustrates an example method 100 for compressing and encoding calibration data according to one embodiment of the invention.

FIG. 1 illustrates an example method 100 for conveying the calibration data to the equipment with which the microsurgical cassette will be used in accordance with one embodiment of the present invention. The example method 100 also illustrates the steps needed to gather the calibration data for a microsurgical cassette. The example method 100 begins at block 102 wherein data points are obtained. Data points are made up of two or more variable values—for example an X coordinate value and a Y coordinate value. Obtaining data points can comprise, for example, measuring values for a first variable at known values for a second related variable for the apparatus to be calibrated. In the illustrated example of a microsurgical cassette, the cassette can be placed in a pressurizing chamber to empirically correlate deflection and pressure values for the particular cassette by measuring diaphragm displacement at known pressures. Sufficient data points should be determined in order to accurately model the measured correlation. Oftentimes, this modeling will be done with a polynomial expression. In the case of a microsurgical cassette for example, a pressure deflection calibration curve may be modeled by a fourth order polynomial.

In order to determine a mathematical function modeling a set of data, a sufficient number of points must be obtained. In the case of a data set modeled by an $n^{th}$ order polynomial for example, a minimum of n+1 data point pairs are needed. Thus, in the example illustrated in FIG. 3, five data point pairs would typically be needed to fully determine the coefficients for a fourth order polynomial modeling the curve 300. In many cases, however, the coordinate pairs needed to fully determine the polynomial will include the origin. For example, a diaphragm in a microsurgical cassette will typically have zero displacement when there is zero pressure difference across the diaphragm. For data sets not including the origin, other boundary values may exist based on the characteristics of the system and offer other pre-determinable data points. In the example of a microsurgical cassette, because the data set will include the origin, only n non-zero additional coordinate pairs are needed to determine an $n^{th}$ order polynomial. Thus, the calibration curve 300 can be determined by obtaining four additional points such as points 322, 316, 306 and 310. Typically, it may be necessary or desirable to obtain more than four additional data pairs, such as data points 320, 304, 308, and 314, in order to improve a mathematical approximation of the calibration curve. For example, a curve of best fit derived from multiple data points may be less subject to error and provide a better overall model of the pressure/displacement correlation for a particular microsurgical cassette than one based on a bare minimum of data points.

Once the data pairs are obtained, the sample method 100 proceeds to block 104 wherein it is determined whether the data are within limits. If the data are not within suitable limits, the method 100 proceeds to block 128 wherein the method 100 fails. For example, for the device whose calibration curve is illustrated in FIG. 3, suitable limits could be from −720 mm Hg to 120 mm Hg and from −200 microns to 700 microns of displacement. Values outside of these limits may indicate an error with either the device or the measuring equipment and it may be desirable to obtain new data. Proper data range values will of course depend on the physical characteristics of each particular system.

Provided the data are within reasonable limits, the method 100 proceeds to block 106 wherein zero offsets can be applied. For example, applying zero offsets to the pressure and deflection values for a microsurgical cassette can comprise adjusting the values for any offset that may have occurred due to nominal offsets, measuring equipment calibration, or possible sources of error in the measuring equipment. For example, a displacement diaphragm may exhibit a baseline deflection even without a pressure difference across the diaphragm and adjustments can be made in block 106 to offset for this amount. Similarly, in other applications, suitable offsets can be used based on other boundary value conditions as determined by a particular system. Once offsets are applied, the sample method 100 proceeds to block 108 wherein it is again determined whether the data points are within allowable limits. If they are not, the method proceeds to block 128 wherein the method fails.

Provided the data points are still within acceptable limits, the method 100 proceeds to block 110 wherein a mathematical function is determined to model the empirical data. Determining a mathematical function allows points along the calibration curve not specifically measured empirically to be identified and allows a console with which a cassette is used to identify a pressure value corresponding to a measured displacement during use of the cassette. For the microsurgical cassette of the present example, determining a mathematical function modeling the calibration data can comprise determining coefficients for a fourth order polynomial that will model the pressure/deflection calibration curve of the following form:

$$y=ax^4+bx^3+cx^2+dx+e$$

Where the coefficients a, b, c, d, and e are the coefficients to be determined and x and y represent variables being correlated, such as deflection and pressure in the current example of a microsurgical cassette. The coefficients for the fourth order polynomial may be determined using standard mathematical techniques. For example, graphing software applications can interpolate or extrapolate from a set of data points a curve of best fit for the data points and then identify a mathematical function—such as a fourth order polynomial with appropriate coefficients—that models the curve. In other embodiments, other suitable functions may of course be used as appropriate for the given application.

Once a mathematical function is determined in block 110 to model the empirical data, the sample method 100 proceeds to block 112 wherein the function is used to calculate target values corresponding to select calibration points. Target values comprise values for a given variable that correspond to a predetermined value of a related variable at a particular data point. For example, the data point 324 illustrated in FIG. 3, comprises two coordinate values—100 mm Hg and −175 microns of pressure. Thus the value −175 microns of deflection can be said to be the target deflection for a pressure value of 100 mm Hg. Target values allow data points to be communicated with fewer bits of data because one coordinate comprising each data point can be decided on in advance with only the target value being sent with the communication. For example, in order to communicate the data points 324, 318, 326, and 312 from FIG. 3, it can be decided in advance that target deflection values corresponding to pressure values of 100, −100, −350, and −600 mm Hg will be communicated. This eliminates the need to send both the deflection and pressure values making up each data points and instead only the values −175, 200, 425, and 600 microns of deflection need to be communicated in order to convey the data points 324, 318, 326, and 312.

The target values determined in step 112 correspond to selection calibration points. Select calibration points are points that allow an approximation of a data curve containing the empirical data points to be determined in a manner less sensitive to minor changes in the calibration points than other points within the data set or along the modeled curve. Thus minor changes in the target values for the select calibration points result in less error between an approximated curve and the actual data set than would occur if other data points were selected to model the data set. For example, the points 324, 302, 318, 326, and 312 will determine the overall behavior of the curve 300 in a manner less sensitive to minor inaccuracies in these data points than would the points 302, 306, 308, 310, and 314. Thus, if one were to use points 302, 306, 308, 310, and 314, the modeled curve based on these points would vary more significantly with minor deviations in the values represented by points 302, 306, 308, 310, and 314.

The set of select calibration points for the curve 300 has been determined heuristically and similar points can similarly be determined for other curves. In order to identify select calibration points for a given system, a first set of points can be identified and a curve determined based on those points.

Then, the value of these points can be modified slightly and a resulting change to the modeled curve can be determined. This process can then be repeated for different data points along the curve or within the data set until points are identified that minimize the impact of changes to the values of the calibration points on the resulting curve.

Because the select calibration data points largely determine the calibration curve and thus the data to be communicated when conveying the calibration curve, the deflection values obtained at block 102 are preferably obtained at or near pressure values corresponding to these select data points so that the accuracy of these points is increased. For example, for the device whose calibration curve is illustrated in FIG. 3, deflection values would preferably be measured at or near pressure values of 100, 0, −100, −350 and −600 mm Hg. Identifying the specific target values in block 112 can be done empirically, by measuring the values precisely at a corresponding value for a determining variable, or can be obtained mathematically once a modeling function has been identified. For example, a precise displacement value corresponding to 100 mm Hg can be determined graphically by extrapolating or interpolating along the curve 300, or can be derived algebraically by substituting the polynomial coefficients into the $4^{th}$ order polynomial with a pressure value of 100 mm Hg. While measuring a displacement value precisely at a select pressure point may yield more accurate results, it is typically more efficient to simply measure a displacement value near each of the select data points and then use a suitable mathematical technique to determine the precise target value for each select data point.

Once the target values corresponding to the select data points are determined, the sample method 100 proceeds to block 114 wherein two of the target values can be quantized into barcode-able values and stored as values named, for example, B1 and B3. Quantizing a target value into a barcodeable value can comprise, for example, rounding, approximating, truncating, or otherwise suitably configuring the target value such that it can be encoded within a limited data space. Rounding the target values can be done by rounding to a nearest value, to a nearest odd or even value, or by other suitable technique determined to yield accurate results within the space available for encoding the target value. According to certain embodiments, the first two target values encoded can correspond to special select data points known as predictor calibration points. Predictor calibration points comprise a subset of the select calibration points that can predict the value of the remaining select calibration points more accurately than other select calibration points. For example, for the curve 300, the points 324 and 318 provide an accurate prediction of the remaining select calibration points 326 and 312 when used with a simple linear predictor function of the form:

$$C_1X_1+C_2X_2=P_1$$

where $C_1$ and $C_2$ represent constants, $X_1$ and $X_2$ represent the target values for the select calibration points 324 and 318, and $P_1$ represents the first predicted value. The fact that the predictor calibration points accurately predict the remaining select calibration points can be used to reduce the amount of information needed to communicate the data curve.

For example, in order to communicate the third target value, certain embodiments of the present invention use a predictor function in block 116 to determine a predicted third target value and then identify a correction between the predicted third target value and actual target value. Once the correction is determined, only the correction needs to be communicated in order to identify the actual target value to the console with which the console will be used as it can determine the predicted value from the first two encoded target values and then modify the predicted value according to the correction to arrive at the actual third target value. The correction represents the transformation needed to arrive at the actual target value given the predicted target value. According to one embodiment, the correction is the arithmetic difference in the predicted target value and actual target value. Once the correction is determined, it can be rendered into a barcode-able format and stored as a value named, for example, B4.

Once the third target value and correction are determined, the example method 100 proceeds to Block 118 wherein a fourth predicted target value is calculated based on a second predictor function that receives as input the first three target values in a manner similar to block 116. After the fourth predicted select value is determined, a correction can determined and quantized into a barcode-able value named, for example, B5.

Once the target values are determined, they can be rendered into a medium. In the current example, barcode-able values B1, B3, B4 and B5 are combined into a data stream in block 120, which can be combined with a check sum in block 122 and rendered into a form suitable for encoding in a barcode. For example, a sequence of binary representations of B1, B3, B4, B5, can be combined with a check sum and then converted to hexadecimal format and finally to a decimal number to be sent in block 124 to a printer for printing a barcode. After the barcode is printed, the method 100 terminates at block 126. According to other embodiments, the target values can be encoded in other suitable media such as RF ID tags, machine readable media, optically readable media, etc.

Figure 2:
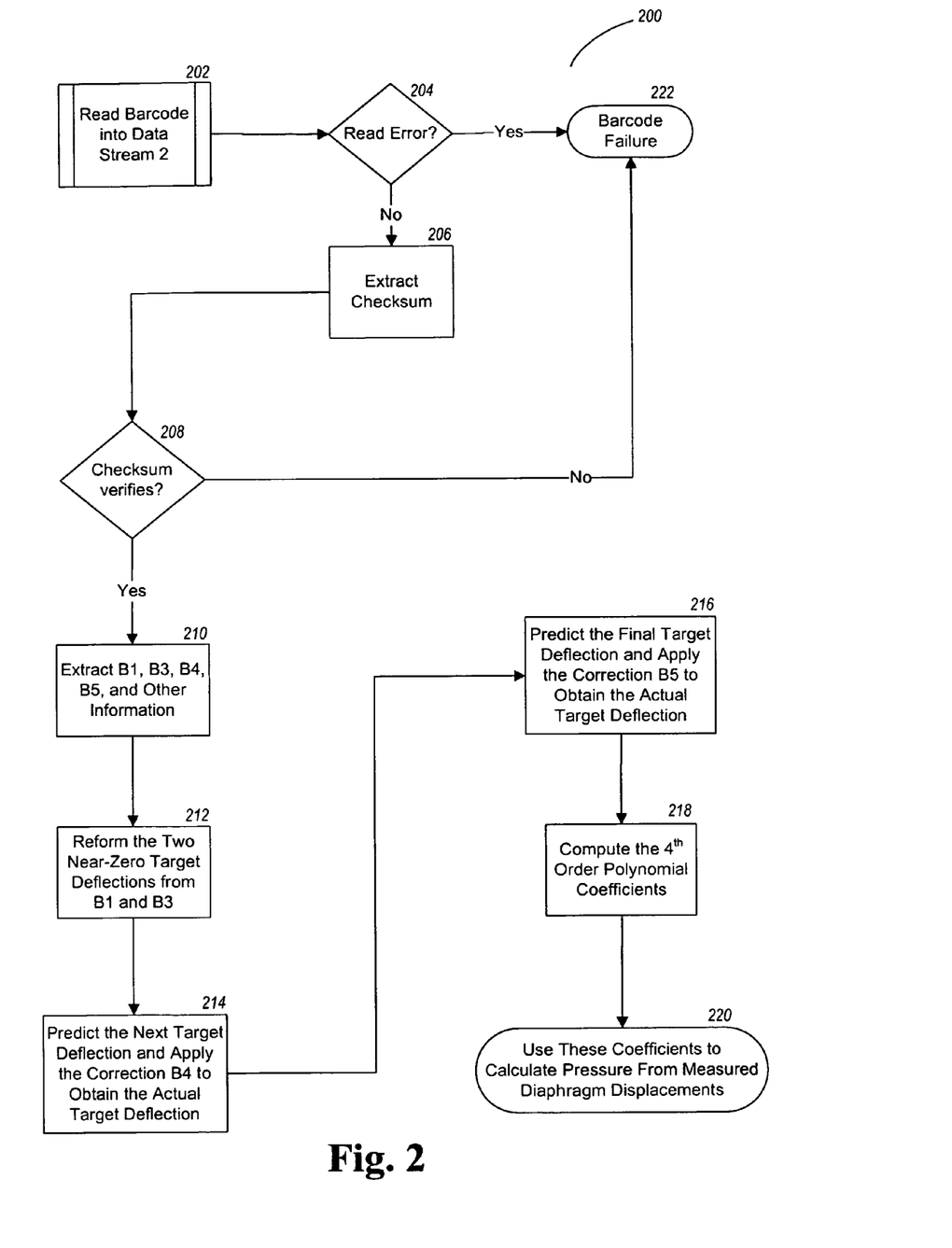
FIG. 2 illustrates an example method 200 for interpreting compressed calibration data according to one embodiment of the invention.

FIG. 2 illustrates an example method 200 for reading a medium, for example a barcode, prepared according to an embodiment of the present invention and extracting from the medium desired information, such as a calibration curve. The method 200 begins in block 202 wherein barcode data is read into a data stream. The barcode can be read from the device for which calibration data is desired. For example, the barcode can appear on a disposable microsurgical cassette for which a pressure/displacement calibration curve is needed.

After the barcode is read in block 202, the method proceeds to block 204 wherein it is determined whether there was a read error. If there is a read error, the method proceeds to block 222 wherein the method fails. Provided there is no read error, the method proceeds to block 206 wherein a check sum is extracted. Once the check sum is extracted, it is verified in block 208. If the check sum does not verify, then the method proceeds to block 222 wherein the method fails.

Provided the check sum is verified, the method proceeds to block 210 wherein the four encoded values B1, B3, B4 and B5 are extracted. Extracting the values B1, B3, B4 and B5 from the barcode can comprise, for example, converting the bar code into binary data and reading portions of the data corresponding to known locations within the barcode.

Within such an example, the encoded values may or may not be equally distributed. For example, it may be determined that one or more of the encoded values bears more heavily on the overall accuracy of the encoded data. In such a case, more bits can be allotted to this value to allow for greater accuracy in the resulting data set. For example, in the embodiment discussed above in connection with the method 100, the first and second target values (which correspond to predictor calibration points 324 and 318 in FIG. 3) can be encoded with greater precision than the corrections for target values 3 and 4 to yield a more accurate calibration curve. Alternatively, the bits used to store the encoded values can be equally distributed such that each encoded value receives the same number of bits.

Once the encoded values are extracted from the barcode, the method 200 proceeds to block 212 wherein the first two target values are reformed. Reforming the first two target values can comprise, for example, converting the extracted data into a desired form and appropriate units. Once the first two encoded data points are reformed in block 212, the method 200 proceeds to block 214 wherein the same predictor function used with method 100 is used to determine the predicted third target value from the first two reformed target values. Once the predicted third target value is obtained, the correction can be used to obtain the actual third target value. For example, when the correction is an arithmetic difference, the correction amount can be added to the predicted value to arrive and the actual third target deflection.

Once the actual third target value is obtained, the method 200 proceeds to block 216 wherein a final predicted target value is obtained using the same second predictor function as used with method 100. A correction for the fourth target value can then be used to arrive at the actual fourth target value from the predicted fourth target value.

Once the four actual target deflection values are obtained in blocks 212-216, the method proceeds to block 218, wherein a mathematical function modeling the curve is determined. For example, according to the present example where the calibration curve is modeled by a fourth order polynomial, the four target values along with the corresponding four predetermined values forming the select data points together with the origin provide five data point sets which can be used to fully determine a fourth order polynomial fitting the five data point pairs according to standard mathematical techniques.

Once a mathematical function modeling the data curve is determined, the method 200 proceeds to block 220 wherein the function is used to calculate needed data points for the calibrated equipment. For example, according to the example illustrated in FIGS. 1-3, the fourth order polynomial with the correct coefficients can be used to calculate pressure values from measured diaphragm displacements. Thus, in use, the equipment can use the modeled calibration curve based on the fourth order polynomial to accurately determine the given pressure for a measured diaphragm displacement.

While the above description contains many specifics, these specifics should not be construed as limitations on the scope of the invention, but merely as exemplifications of the disclosed embodiments. Those skilled in the art will envision any other possible variations that are within the scope of the invention.

That which is claimed:

1. A method for generating a calibration data curve, comprising the steps of:
   determining a first target value that corresponds to a predetermined coordinate of a first selected data point that corresponds to the data curve;
   determining a second target value that corresponds to a predetermined coordinate of a second selected data point that corresponds to the data curve;
   determining a predicted third target value based on the first target value, the second target value, and a first predetermined predictor function;
   determining an actual third target value that corresponds to a predetermined coordinate of a third selected data point that corresponds to the data curve;
   determining a first correction between the predicted third target value and the actual third target value;
   determining a predicted fourth target value based on the first target value, the second target value, the actual third target value, and a second predetermined predictor function;
   determining an actual fourth target value that corresponds to a predetermined coordinate of a fourth selected data point that corresponds to the data curve;
   determining a second correction between the predicted fourth target value and the actual fourth target value; and
   generating a calibration data curve based on the first selected data point the second selected data point, the third selected data point and the fourth selected data point.

2. The method of claim 1, wherein the first selected data point is on the data curve.

3. The method of claim 1, wherein the data curve is modeled using a fourth order polynomial.

4. The method of claim 1, wherein the first selected data point, second selected data point, third selected data point, and fourth selected data point are select calibration points, which determine a mathematical function modeling the data curve with greater accuracy, despite minor errors in the target values corresponding to the select calibration points, than other points corresponding to the data curve.

5. The method of claim 1, further comprising the step of communicating the first target value, the second target value, the first correction and the second correction on a linear barcode.

6. The method of claim 1, wherein the first selected data point and the second selected data point are predictor calibration points heuristically identified to more accurately predict remaining selected data point than other combinations of any two of the first, second, third, and fourth selected data points.

7. A method for identifying data needed to generate a calibration data curve, comprising:
   determining an $n^{th}$ order polynomial to model the data curve;
   selecting a number n of select data points that correspond to the data curve, wherein the curve passes through a determinable point;
   for each of the selected data points, identifying a target value that corresponds to the selected data point, wherein the target value is a coordinate value;
   determining a predictor function that predicts a predicted target value based on a subset of the target values for the selected data points;
   determining a correction between the predicted target value and an actual target value on the data curve,
   generating a target data curve based on the polynomial, the target values for the subset of selected data points, the predictor function, and the correction; and
   generating a calibration data curve based on the target data curve.

8. The method of claim 7, wherein the determinable point is the origin.

9. The method of claim 7, wherein n is equal to four and the subset of target values for the selected data points comprises two target values.

10. A method of generating a calibration data curve, comprising the steps of:
    encoding in a medium a first target coordinate along a first axis, wherein the first target coordinate corresponds to a first predetermined coordinate along a second axis, and wherein the first target coordinate and the first predetermined coordinate identify a predictor calibration data point;

encoding in the medium a correction between a predicted second target coordinate along the first axis and an actual second target coordinate along the first axis, wherein the actual second target coordinate corresponds to a second predetermined coordinate along the second axis, wherein the predicted second target coordinate is based at least in part on the predictor calibration data point, and wherein the actual second target coordinate and the second predetermined coordinate identify a second calibration data point;

wherein a mathematical function modeling the data curve is determined at least in part by the predictor calibration point and the second calibration point; and generating a calibration data curve based on the determined mathematical function.

11. The method of claim 10, wherein the mathematical function is one of a polynomial, Fourier series, periodic function, exponential function, hyperbolic function, logarithmic function, or trigonometric function.

12. The method of claim 10, wherein the mathematical function is further determined by a boundary value condition.

13. The method of claim 12, wherein the boundary value condition includes the origin.

14. The method of claim 10, wherein the mathematical function is a fourth order polynomial, and further comprising encoding third and fourth calibration points, wherein one of the third and fourth calibration points is a second predictor calibration point, and wherein the data curve includes the origin.

15. The method of claim 10, wherein a linear predictor function of at least the first target coordinate is used to predict the predicted second target coordinate.

16. The method of claim 10, wherein a linear predictor function of the first target coordinate and a target coordinate for a second predictor calibration point are used to predict the predicted second target coordinate and wherein the first target coordinate, the target coordinate for the second predictor calibration point, and the actual second target coordinate are used to predict a fourth calibration point.

17. The method of claim 10, wherein the medium is a linear barcode.

18. The method of claim 17, wherein a great number of bits within the linear barcode are used to represent the predictor calibration point than are used to represent the correction.

19. The method of claim 10, wherein the first axis and second axis form at least part of a Cartesian coordinate system, spherical coordinate system, or polar coordinate system.

20. A method of generating a calibration data curve comprising:
identifying a first target value that corresponds to a predetermined coordinate of a first selected data point that corresponds to the data curve;
identifying a second target value that corresponds to a predetermined coordinate of a second selected data point that corresponds to the data curve;
calculating a predicted third target value based on the first target value, the second target value, and a first predetermined predictor function;
identifying a first correction between the predicted third target value and the actual third target value;
calculating an actual third target value that corresponds to a predetermined coordinate of a third selected data point that corresponds to the data curve based on the correction and the predicted third target value;
calculating a predicted fourth target value based on the first target value, the second target value, the actual third target value, and a second predetermined predictor function;
identifying a second correction between the predicted fourth target value and the actual fourth target value;
calculating an actual fourth target value that corresponds to a predetermined coordinate of a fourth selected data point that corresponds to the data curve;
determining the mathematical function modeling the data curve based on the first target value, the second target value, the first correction and the second correction; and
generating a calibration data curve based on the determined mathematical function.

* * * * *